United States Patent [19]

Heimgartner et al.

[11] Patent Number: 4,864,522

[45] Date of Patent: Sep. 5, 1989

[54] PROCESS FOR THE SAMPLING OF AN ELECTRIC SIGNAL VARYING OVER TIME AND APPARATUS FOR THE IMPLEMENTATION AND APPLICATION OF THIS PROCESS

[75] Inventors: Dieter Heimgartner, Remetschwil; Meinolph Kaufmann, Baden; Hanspeter Schad, Rieden, all of Switzerland

[73] Assignee: BBC Brown Boveri AG, Baden, Switzerland

[21] Appl. No.: 160,249

[22] Filed: Feb. 25, 1988

[30] Foreign Application Priority Data

Feb. 25, 1987 [CH] Switzerland .............. 718/87

[51] Int. Cl.⁴ .................. G01R 13/34; G01M 11/00
[52] U.S. Cl. .................. 364/575; 324/77 R; 341/137; 356/73.1; 364/550; 364/557
[58] Field of Search .......... 364/487, 550, 551.01, 364/557, 575, 556; 250/327.2 C, 327.22; 324/77 B, 77 R; 356/73.1; 315/8.51; 341/122, 137

[56] References Cited

U.S. PATENT DOCUMENTS

| | | | |
|---|---|---|---|
| 4,034,362 | 7/1977 | Balanca et al. | 341/137 |
| 4,529,930 | 7/1985 | Evel et al. | 324/77 R |
| 4,594,733 | 6/1986 | Kanzaki et al. | 341/122 |
| 4,647,909 | 3/1987 | Spalding | 341/122 |
| 4,760,257 | 7/1988 | Pollack et al. | 356/73.1 |
| 4,767,207 | 8/1988 | Takiguchi | 356/73.1 |

FOREIGN PATENT DOCUMENTS 2331794 6/1977 France .
00933 3/1983 World Int. Prop. O. .

OTHER PUBLICATIONS

Bell System Tech. Jour., vol. 56, No. 3 (3/77); "Photo Probe–an Optical Fiber Time–Domain Reflectometer"; Personick, S. D.; pp. 355–367.
Elect. Letters, vol. 21, No. 13 (6/85); "Distributed Optical Fibre Raman Temperature. . . "; pp. 569–570.
Jour. Elect. Eng. vol. 23, No. 236 (8/86); "Otdr Makes Breakthrough in Accuracy and Dynamic Range"; Kitagawa, K.; pp. 62–65.
EG&G Reticon Application Notes, No. 101; (1975) "Application of Reticon Photodiode Arrays as Electron and X-Ray Detectors"; pp. 165–168.

Primary Examiner—Parshotam S. Lall
Assistant Examiner—Kevin S. Teska
Attorney, Agent, or Firm—Oblon, Spivak, McClelland, Maier & Neustadt

[57] ABSTRACT

In a process for the sampling of an electric signal changing over time, an electron beam (12) is deflected laterally and linearly over time and at the same time modulated in its intensity according to the instantaneous amplitude of the electric signal. The electron beam (12) generates on a fluorescent screen (14) a brightness-modulated bar of light, which is preferably sampled with a sensor (15) arranged ahead of the fluorescent screen (14) in the form of a CCD line camera having a linear array of sensor elements (15a, b, c).

The read-out analog sampled values of the sensor (15) are subsequently digitized and further processed.

The advantage of the process is its high broad-bandedness and resolution and the capability of being able to carry out an averaging without additional expenditure of time.

5 Claims, 2 Drawing Sheets

PROCESS FOR THE SAMPLING OF AN ELECTRIC SIGNAL VARYING OVER TIME AND APPARATUS FOR THE IMPLEMENTATION AND APPLICATION OF THIS PROCESS

BACKGROUND OF THE INVENTION

1. FIELD OF THE INVENTION

The invention relates in general to the field of metrology. It relates specifically to a process for the sampling of an electric signal varying over time, an apparatus for the implementation of this process and an application of the process.

2. DISCUSSION OF BACKGROUND

In fiber optic metrology, it has long since been known to investigate the attenuation characteristic of glass fibers with the aid of so-called optical time domain reflectrometry (OTDR) and to determine the variation in attenuation along the fiber (see for example S. D. Personick in "The Bell Systems Technical Journal", Vol. 56, No. 3, March 1977, pp. 355–366).

In the case of such OTDR measurements, short light pulses are launched into the glass fiber to be investigated. The elastic and unelastic scattering (Rayleigh and Raman scattering) during passage of the light pulse through the fiber produces a backscattering signal which is coupled out at the fiber input and converted by means of a photodetector (for example an avalanche photodiode APD) into a corresponding electric signal.

Now it is also known to use OTDR measurements on glass fibers (optical waveguides) for high-sensitivity resolved temperature measurement (see for example Electronics Letters, Vol. 21, No. 13, June 1985, pp. 569, 570). This involves filtering out the very weak, temperature-dependent component of the Raman scattering from the backscattering signal and using a conventional boxcar or transient recorder averager to eliminate the noise in the time-dependent electric signal produced in the photodetector, in order that it can then be processed further.

In the case of the conventional processes of signal sampling and averaging by a boxcar averager or transient recorder, long integration or averaging times, of the order of minutes to hours, are required for conditioning of the very noisy signals, as averaging is performed exclusively in digital mode and represents a separate operation.

The advantages and disadvantages of the known processes can be listed in an overview as follows:

A. Boxcar averager

Advantages:
very high bandwidth;
no additional expenditure of time due to averaging, as this is performed value by value;
the repetition time in periodic sampling is therefore not limited by the averaging process;
Disadvantages:
with periodic sampling operations, only one measured value per period, i.e. one per point, can be acquired;
very many repeat measurements are necessary for a lengthy signal curve;
at 6–8 bits, the resolution is low.

B. Transient recorder averager

Advantages:
the entire curve trace of a signal is recorded within one measuring period; therefore, individual signals can also be sampled without repetition;
Disadvantages:
the bandwidth is limited by the A/D converter to approximately 100 MHz;
at 6–8 bits, the resolution is low;
additional time is required for the averaging, limiting the repetition time.

If an averaging over 1,000 curve traces with 1,000 sampling points per curve trace is taken as a basis, the following, for example, may be said for the known processes with respect to the time requirement necessary for sampling:

At a repetition frequency of 10 kHz, a boxcar system requires a time of 100 s, a transient recorder system with an averaging rate of 100k samples/s requires 10 s, the repetition frequency being limited in this case to 100 Hz due to the subsequent averaging.

It may be deduced from the statements made above that the two conventional sampling processes are very time-consuming, specifically also with respect to their averaging capabilities, and furthermore have low resolution.

SUMMARY OF THE INVENTION

Accordingly, one object of this invention is to provide a novel sampling process for electric signals and an apparatus for the implementation of the process which operate at high bandwidth and resolution and make possible a very fast averaging in the case of repeating signals.

The object is achieved in the case of a process of the type stated at the beginning by the following steps:
an electron beam of controllable intensity is deflected laterally and linearly over time;
the intensity of the electron beam is modulated during the deflection according to the instantaneous amplitude of the electric signal;
the electron beam is deflected along a sensor consisting of a plurality of sensor elements arranged alongside one another; and
the locally varying intensity of the electron beam is converted by means of the sensor elements into electric, analog sampling values and further processed in this form.

The apparatus according to the invention for implementation of the process comprises
an electron beam tube;
in the electron beam tube, means for modulation of the intensity of the electron beam;
a deflection device for the deflection of the electron beam;
a sensor which consists of a plurality of sensor elements arranged alongside one another and which is arranged on the electron beam tube in such a way that the deflected electron beam travels successively along the sensor elements;
a time base for controlling the deflection device; and
a data processor for processing the sampled values occurring in the sensor during sampling.

According to a preferred exemplary embodiment for the apparatus
the electron beam tube has a fluorescent screen;
the sensor is a CCD line camera which, apart from the sensor elements, contains corresponding storage elements which are assigned to the sensor elements and form a CCD shift register.

In one application, the process according to the invention is used for signal conditioning of the back-scattering signals occurring in optical time domain reflectrometry measurements on glass fibers, in particular for high-sensitivity resolved temperature measurement.

The essence of the invention consists in transforming the time sampling of the electric signal into a position sampling by way of modulation and control of the electron beam. The beam control can be executed without inertia and over an extremely broad band. The physically distributed sensor makes possible a direct, analog averaging of the sampling values per sensor element without additional expenditure of time.

The invention produces the following advantages:
- with brightness (intensity) modulation, a high resolution and dynamic range are achieved;
- averaging is performed without additional expenditure of time, as it takes place in analog mode;
- a high bandwidth can be achieved (with standard electron tubes up to 180 MHz, with special tubes correspondingly higher);
- the sampled values need be read out only once, after averaging, via an A/D converter;
- operation can be carried out in a similarly simple and convenient way as with an oscilloscope (for example with zoom or delay function);
- the process is also suitable for the sampling of individual signals.

BRIEF DESCRIPTION OF THE DRAWING

A more complete appreciation of the invention and many of the attendant advantages thereof will be readily obtained as the same becomes better understood by reference to the following detailed description when considered in connection with the accompanying drawings wherein.

DESCRIPTION OF THE PREFERRED EMBODIMENTS

Figure 1:
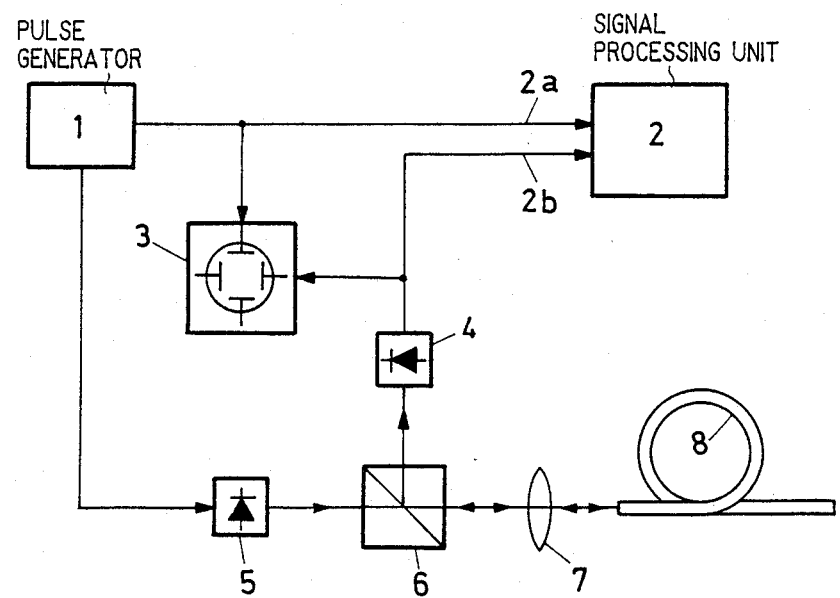
FIG. 1 shows the basic design of a known OTDR measuring system.

Referring now to the drawings, wherein like reference numerals designate identical or corresponding parts throughout the several views, in FIG. 1 the basic design of a test setup usually used for OTDR measurement is shown, as it has already been described in the introduction.

Test object is in this case a glass fiber 8 which, indicated by the winding, can have a length of many meters to kilometers. On the input side of the glass fiber 8, an optical launch system 7 is used both to launch light and also to couple out again the resulting back-scattering signal (shown by the double-headed arrow).

The light used for the measurement in the form of a short light pulse originates, for example, from a laser diode 5, which is controlled by a pulse generator 1. Between the laser diode 5 and the optical launch system 7 is arranged a beam splitter 6, which allows the primary light pulse originating from the laser diode 5 to pass unhindered but laterally reflects the returning backscattering pulse, which contains the information on the attenuation characteristic of the glass fiber 8, and directs it onto a photodetector, for example an avalanche photodiode (APD) 4.

In the avalanche photodiode 4, the incoming light signal is converted into a corresponding electric signal and either displayed on an oscilloscope 3 or evaluated in a signal processing unit 2. Both the oscilloscope 3 and the signal processing unit 2 are connected to the pulse generator 1 for synchronization. If it is to be used for high-sensitivity resolved temperature measurement along the glass fiber 8, the general OTDR system represented in FIG. 1 must be modified accordingly. A major modification in this case consists in inserting a wavelength-dependent device (for example a monochromator) between the beam splitter 6 and the avalanche photodiode 4 in order to filter out from the backscatter spectrum the weak Raman components required for an evaluation.

In the case of this type of measurement, as can easily be appreciated, the signals available at the output of the avalanche photodiode 4 are extremely weak and also very noisy and first have to be subjected to a time-consuming sampling and averaging process in order to achieve a quality suitable for evaluation. In the prior art, processes are used for this purpose (boxcar or transient recorder) in which the electric signal varying over time is directly sampled, digitized and subsequently digitally averaged.

Figure 2:
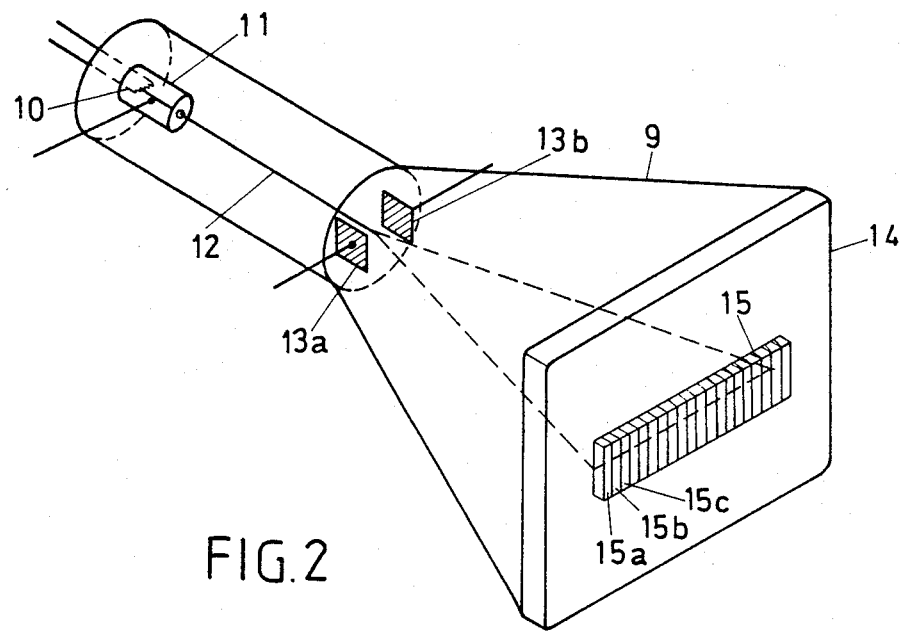
FIG. 2 shows, in perspective representation, the design of an electron beam tube with attached sensor, according to a preferred exemplary embodiment of the invention.

The invention is now based here on a completely different approach which seems like a less direct route but has essential advantages over the known processes. The crux of the invention is a combination of an electron beam tube 9 and a precision-sensitive sensor 15 (FIG. 2).

The electron beam tube 9 is preferably similar in design and equipment to a usual oscilloscope tube with an electron source 10 and an electrostatic deflection device having at least one pair of deflector plates 13a, b. It should be pointed out at this stage that a magnetically acting deflection device may be employed just as well as an electrostatically acting device.

Apart from the deflection device for the deflection of the electron beam 12, also provided in the electron beam tube 9 are means for modulation of the intensity of the electron beam 12, as are known for example from oscilloscopes with z input (brightness control). These may, in particular, take the form of a so-called Wehnelt cylinder 11, via which the intensity of the electron beam 12 is influenced.

With the process according to the invention, now the electron beam 12 is deflected linearly over time (saw tooth-shaped deflection voltage) in the electron beam tube 9 by means of the deflector plates 13a, b. During this deflection, its intensity is modulated by the instantaneous value of the amplitude of the electric signal to be sampled. In this way, the electron beam describes, with changing intensity, a straight line on the front side of the electron beam tube 9.

A fluorescent screen 14, which converts the trace of the intensity-modulated electron beam 12 into a brightness-modulated bar of light, is preferably fitted on this front side.

This brightness-modulated bar of light is sampled by a light-sensitive and high-sensitivity resolving sensor 15 which is arranged ahead of the fluorescent screen 14 and consists of a plurality of sensor elements 15a, b, c arranged alongside one another.

The locally varying brightness of the beam of light results, in the various sensor elements 15a, b, c, in analog signals of correspondingly different intensity, from which an electric output signal comparable to the input signal can be obtained again during reading out.

The decisive advantage of this less direct route by way of electron optics becomes clear if the problem of averaging over periodically repeating signals is included in considerations: in the case of the process according to the invention, the averaging may be carried out in analog mode in the manner of an integration for each sensor element 15a, b, c directly and without additional expenditure of time, as a result of which the expenditure of time on signal regeneration in the high-sensitivity resolved temperature measuring process can be drastically reduced in comparison with conventional techniques, without sacrificing resolution and bandwidth.

The process can be realized particularly favorably if a so-called CCD line camera (CCD=Charge Coupled Device) is employed as sensor 15. In such a CCD line camera, each photo-sensitive sensor element of a linear array is assigned corresponding storage elements, which together form a CCD shift register, in which the photosignals can be individually integrated and subsequently read out and digitized one after the other. The entire setup thus forms an optical multichannel analyzer with extreme bandwidth and averaging speed.

Depending on the fineness of the electron beam 12, the sensor 15 may be fitted either directly onto the fluorescent screen 14 or connected optically to the fluorescent screen 14 with an interposed optical reducing system. Furthermore, integrated versions in which the sensor 15 is housed directly in the vacuum flask of the electron beam tube 9 are also conceivable. In addition, it is possible to detect the electron beam directly with a sensor sensitive to electrons, without the indirect route by way of the fluorescent screen 14 and photodetection. Such a diode array is obtainable for example under the name "Reticon" from the company EG+G, USA (see for example Application Note No. 101 of Messrs. EG+G Reticon, Sunnyvale, Calif., USA).

Figure 3:
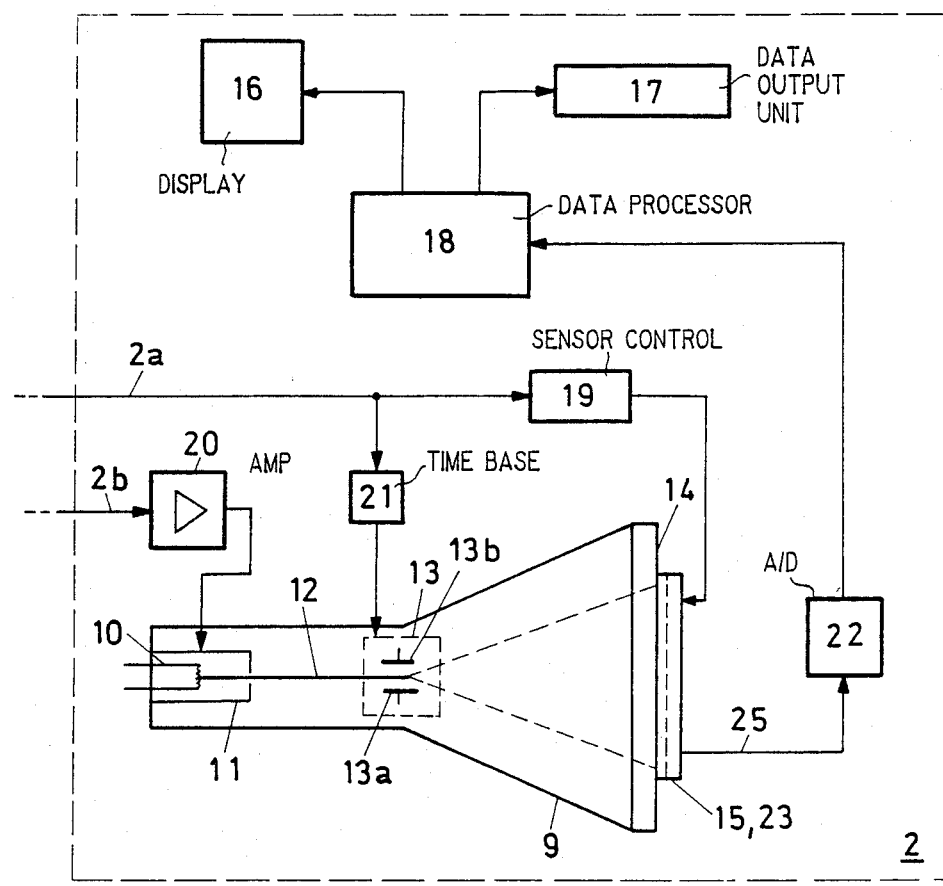
FIG. 3 shows the basic design of an arrangement for the sampling of electric signals, according to an embodiment of the invention.

With the combination of electron beam tube 9 and sensor 15, now an effective signal processing unit 2 can be constructed in an OTDR setup as shown in FIG. 1. Such a signal processing unit 2 is reproduced in the basic circuit diagram in FIG. 3.

The electric backscattering signal from the avalanche photodiode 4 (FIG. 1) passes via a signal input 2b onto a broadband amplifier 20, is amplified there and passed on for controlling the Wehnelt cylinder 11 to the electron beam tube 9. As the brightness control by means of the Wehnelt cylinder follows a non-linear characteristic, the broadband amplifier 20 must be designed correspondingly in its transmission characteristic in order to compensate for this non-linearity.

A suitable trigger pulse is emitted in each case from the pulse generator 1 (FIG. 1) via a trigger input 2a onto a time base 21 and a sensor control 19. The time base 21 generates a control voltage necessary for the time-linear deflection of the electron beam 12, which voltage is fed to the deflection device 13 of the electron beam tube 9 by the deflector plates 13a, b.

The sensor control 19 takes over the control of the sensor 15, i.e. sets the storage elements to zero before a measurement and controls the reading out of the stored measured values and average values. The detailed design of the sensor control 19 depends on the type of the sensor 15 and, in the case of a CCD line camera, may be taken from the application notes of the sensor manufacturer.

The analog, averaged sampling values of the sensor elements appear during reading one after the other at a sensor output 25, are passed on from there to an A/D converter 22, digitized, and finally evaluated in a data processor 18. Downstream of the data processor 18, a visual display unit 16 for the graphic representation of the entire backscattering signal and a data output unit 17 may be arranged, at which the glass fiber parameters obtained from the backscattering signal (in the case of a general OTDR measurement) or the temperature distribution along the glass fiber (in the case of a high-sensitivity resolved temperature measurement) are output.

Figure 4:
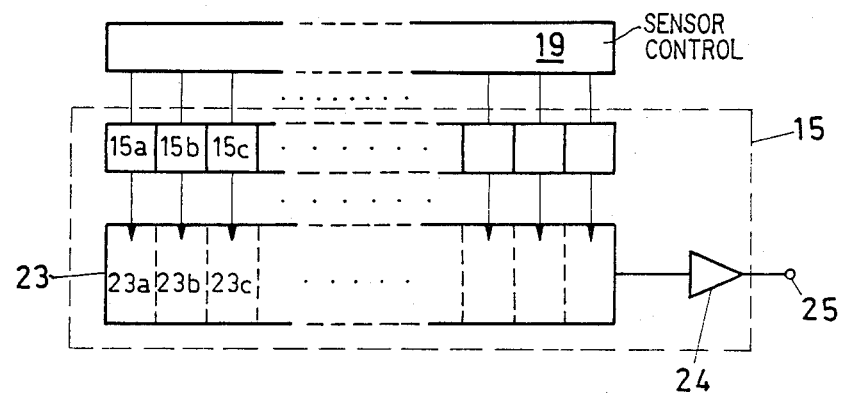
FIG. 4 shows the structure of a CCD line camera used as sensor in the apparatus according to the invention.

In FIG. 4, it is once again illustrated how the sensor control 19 and the sensor 15 interact in the case of the CCD line camera. The sensor 15 includes the light-sensitive sensor elements 15a, b, c in a linear array. Each of the sensor elements 15a, b, c is assigned a corresponding storage element 23a, b, c. The storage elements 23a, b, c together form a CCD shift register 23.

The sensor control 19 acts directly on each cell of the sensor 15 formed from the sensor element 15a, b, c and the associated storage element 23a, b, c. During reading out, the stored, analog charge values in the CCD shift register 23 are successively shifted to the right, amplified in an output amplifier 24 and passed to the sensor output 25.

It is also conceivable furthermore to operate with an optical light system instead of with an optical electron system, i.e. to modulate a light beam in brightness and deflect linearly, for example with a semicircular mirror.

All in all, an extremely broad-band, high-resolving and very fast sampling of an electric signal is made possible, the direct analog averaging with periodically repeating signals being particularly notable.

Obviously, numerous modifications and variations of the present invention are possible in the light of the above teachings. It is therefore to be understood that within the scope of the appended claims, the invention may be practiced otherwise than as specifically described.

What is claimed as new and desired to be secured by Letters Patent of the United States is:

1. Process for sampling several electric signals varying over time, comprising the steps of:
   generating an electron beam having a controllable intensity;
   deflecting said electron beam laterally and linearly over time;
   successively modulating the intensity of the electron beam during the deflection by an instanteous amplitude of the electric signals;
   successively converting the intensity of the electron beam into samples values by a sensor consisting of a plurality of sensor elements arranged alongside one another;
   analogly averaging the samples values directly in each of the sensor elements; and
   successively reading out and digitizing the averaged, sample values.

2. Process for sampling several electric signals varying over time comprising the steps of:
   generating an electron beam having a controllable intensity;

deflecting said electron beam laterally and linearly over time by a saw tooth voltage, thereby generating a bar of light on a fluorescent screen;

successively modulating the intensity of the electron beam during the deflection by an instanteous amplitude of the electric signals, thereby generating an intensity modulated bar of light;

converting the intensity modulated bar of light into sampled values by a light-sensitive sensor, said light-sensitive sensor comprising a plurality of sensor elements arranged alongside one another and a storage element for each of the sensor elements;

analogly averaging the sampled values in each of the storage elements; and successively reading out and digitizing the averaged, sampled values.

3. Apparatus for sampling several electric signals varying over time, comprising:

an electron beam tube generating an electron beam having a controllable intensity;

a deflection device for laterally deflecting said electron beam;

a time base controlling the deflection device and generating a saw tooth-shaped voltage for successively deflecting said electron beam laterally and linearly over time;

means for successively modulating the intensity of the electron beam during the deflection by an instanteous amplitude of the electric signals;

a sensor for sampling the intensity of the electron beam, said sensor comprising a plurality of sensor elements arranged alongside one another and a storage element for each sensor element for analog averaging, said sensor being arranged on the electron beam tube such that the deflected electron beam successively sweeps over the sensor elements;

a data processor for processing sampled and averaged values.

4. Apparatus for sampling several electric signals varying over time, comprising:

an electron beam tube generating an electron beam having a controllable intensity;

a deflection device for laterally reflecting said electron beam on a fluorescent screen;

a time base controlling the deflection device and generating a saw tooth-shaped voltage for successively deflecting said electron beam laterally and linearly over time;

means for successively modulating the intensity of the electron beam during the deflection by an instanteous amplitude of the electric signals and for generating an intensity modulated light bar on the fluorescent screen;

a CCD line camera for converting and averaging the intensity modulated light bar into sampled values, said CCD line camera comprising a plurality of sensor elements arranged alongside one another and storage elements, which are assigned to the sensor elements and form a CCD shift register, said sensor being arranged on the electron beam tube such that the deflected electron beam successively sweeps over the sensor elements;

a sensor control acting on the CCD shift register by setting the storage elements to zero before a measurement and reading out the averaged sampled values;

an A/D converter for digitizing the averaged sampled values; and a data processor for processing said digitized sampled values.

5. Apparatus for signal conditioning or periodically repeating backscattering signals occurring in optical time domain reflectometry measurements on glass fibers, comprising:

an electron beam tube generating a electron beam having a controllable intensity;

a deflection device for laterally deflecting said electron beam on a fluorescent screen;

a time base controlling the deflection device and generating a saw tooth-shaped voltage for successively deflecting said electron beam laterally and linearly over time;

means for successively modulating the intensity of the electron beam during the deflection by an instanteous amplitude of the backscattering signals and for generating an intensity modulated bar of light on the fluorescent screen;

a CCD screen for converting and averaging the intensity modulated bar of light into sampled values, said CCD line camera comprising a plurality of sensor elements arranged alongside one another and storage elements, which are assigned to the sensor elements and form a CCD shift register, said sensor being arranged on the electron beam tube such that the deflected electron beam successively sweeps over the sensor elements;

a sensor control acting on the CCD shift register by setting the storage elements to zero before a measurement and reading out the averaged sampled values;

an A/D converter for digitizing the sampled values; and a data processor for processing said digitized sampled values.

* * * * *